United States Patent
Lee et al.

(10) Patent No.: US 9,786,840 B2
(45) Date of Patent: Oct. 10, 2017

(54) ELECTRONIC DEVICE AND METHOD FOR FABRICATING THE SAME

(71) Applicant: SK hynix Inc., Icheon-Si (KR)

(72) Inventors: Min-Suk Lee, Icheon-Si (KR);
Chan-Sik Park, Icheon-Si (KR);
Jae-Heon Kim, Icheon-Si (KR);
Choi-Dong Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/621,646

(22) Filed: Feb. 13, 2015

(65) Prior Publication Data

US 2015/0162526 A1   Jun. 11, 2015

Related U.S. Application Data

(63) Continuation of application No. 14/229,745, filed on Mar. 28, 2014, now Pat. No. 8,959,250.

(30) Foreign Application Priority Data

Jun. 5, 2013   (KR) ........................ 10-2013-0064700

(51) Int. Cl.
| | |
|---|---|
| *G06F 3/06* | (2006.01) |
| *H01L 43/12* | (2006.01) |
| *H01L 43/08* | (2006.01) |
| *H01L 45/00* | (2006.01) |
| *H01L 27/108* | (2006.01) |

(Continued)

(52) U.S. Cl.
CPC ............ *H01L 43/12* (2013.01); *H01L 27/108* (2013.01); *H01L 43/08* (2013.01); *H01L 45/04* (2013.01); *H01L 45/06* (2013.01); *H01L 45/1233* (2013.01); *H01L 45/141* (2013.01);
(Continued)

(58) Field of Classification Search
None
See application file for complete search history.

(56) References Cited

U.S. PATENT DOCUMENTS

| | | |
|---|---|---|
| 6,114,719 A | 9/2000 | Dill et al. |
| 7,046,489 B2 | 5/2006 | Kamiguchi et al. |

(Continued)

FOREIGN PATENT DOCUMENTS

| | | |
|---|---|---|
| KR | 1020030000137 A | 1/2003 |
| KR | 1020030054175 A | 7/2003 |

(Continued)

OTHER PUBLICATIONS

USPTO Final Office Action issued for U.S. Appl. No. 14/158,702, mailed Dec. 23, 2015 (10 pages).

(Continued)

*Primary Examiner* — Scott Sun
(74) *Attorney, Agent, or Firm* — Perkins Coie LLP

(57) ABSTRACT

An electronic device including a semiconductor memory is provided. The semiconductor memory includes an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer.

20 Claims, 16 Drawing Sheets

(51) Int. Cl.
  *G06F 13/00* (2006.01)
  *H01L 27/11* (2006.01)
  *H01L 27/11507* (2017.01)

(52) U.S. Cl.
  CPC .............. *H01L 45/16* (2013.01); *H01L 27/11* (2013.01); *H01L 27/11507* (2013.01)

(56) References Cited

U.S. PATENT DOCUMENTS

| | | | |
|---|---|---|---|
| 8,084,835 B2 | 12/2011 | Ranjan et al. | |
| 9,130,155 B2 | 9/2015 | Chepulskyy et al. | |
| 2002/0146895 A1 | 10/2002 | Ramdani et al. | |
| 2006/0098354 A1 | 5/2006 | Parkin | |
| 2006/0261425 A1 | 11/2006 | Suemitsu et al. | |
| 2007/0076471 A1 | 4/2007 | Kano et al. | |
| 2007/0187785 A1 | 8/2007 | Hung et al. | |
| 2007/0297220 A1 | 12/2007 | Yoshikawa et al. | |
| 2010/0074092 A1 | 3/2010 | Zhu et al. | |
| 2010/0080048 A1 | 4/2010 | Liu et al. | |
| 2011/0089507 A1* | 4/2011 | Mao | H01L 27/222 257/421 |
| 2011/0198756 A1 | 8/2011 | Thenappan et al. | |
| 2011/0248235 A1 | 10/2011 | Jeong et al. | |
| 2011/0297646 A1* | 12/2011 | deVillers | G03F 7/40 216/49 |
| 2012/0092923 A1 | 4/2012 | Bedeschi et al. | |
| 2012/0326252 A1 | 12/2012 | Yamakawa et al. | |
| 2013/0005151 A1* | 1/2013 | Chen | H01L 21/76816 438/702 |
| 2013/0043530 A1 | 2/2013 | Kim et al. | |
| 2013/0052826 A1* | 2/2013 | Nepomnishy | G21K 1/025 438/694 |
| 2013/0119494 A1 | 5/2013 | Li et al. | |
| 2013/0134534 A1 | 5/2013 | Sbiaa et al. | |
| 2013/0161768 A1 | 6/2013 | Khvalkovskiy et al. | |
| 2013/0248798 A1* | 9/2013 | Yi | H01L 45/04 257/2 |
| 2014/0099735 A1 | 4/2014 | Horng et al. | |
| 2014/0242418 A1 | 8/2014 | Shukh | |
| 2014/0247648 A1 | 9/2014 | Yoon | |
| 2014/0327095 A1 | 11/2014 | Kim et al. | |
| 2015/0092480 A1 | 4/2015 | Choi et al. | |
| 2015/0249206 A1 | 9/2015 | Kim et al. | |
| 2015/0357557 A1 | 12/2015 | Kim et al. | |
| 2016/0180905 A1 | 6/2016 | Kim et al. | |
| 2016/0181514 A1 | 6/2016 | Kim et al. | |
| 2016/0308121 A1 | 10/2016 | Kim | |
| 2017/0062712 A1 | 3/2017 | Choi et al. | |
| 2017/0069837 A1 | 3/2017 | Choi et al. | |

FOREIGN PATENT DOCUMENTS

| | | |
|---|---|---|
| KR | 1020040005472 A | 1/2004 |
| KR | 1020060000878 A | 1/2004 |
| KR | 100641500 B1 | 10/2006 |
| KR | 1020060118311 A | 11/2006 |
| KR | 1020070036704 A | 4/2007 |
| KR | 1020070054551 A | 5/2007 |
| KR | 1020090038809 A | 4/2009 |
| KR | 1020100005449 A | 1/2010 |
| KR | 1020100030054 A | 3/2010 |
| KR | 1020100128219 A | 12/2010 |
| KR | 101073132 B1 | 6/2011 |
| KR | 101055595 B1 | 8/2011 |
| KR | 1020120047356 A | 5/2012 |
| KR | 1020120058113 A | 6/2012 |
| KR | 1020120078631 A | 7/2012 |
| KR | 101171387 B1 | 8/2012 |
| KR | 101209328 B1 | 12/2012 |
| KR | 1020130069097 A | 6/2013 |
| KR | 1020140011138 A | 1/2014 |
| KR | 1020140025165 A | 3/2014 |

OTHER PUBLICATIONS

USPTO Non-Final Office Action issued for U.S. Appl. No. 14/158,702, mailed Jul. 17, 2015 (16 pages).
USPTO Non-Final Office Action issued for U.S. Appl. No. 14/295,229 mailed May 22, 2015 (14 pages).
USPTO Non-Final Office Action issued for U.S. Appl. No. 14/918,356, dated Apr. 7, 2017 (68 pages).
USPTO Final Office Action issued for U.S. Appl. No. 14/846,812, dated May 3, 2017 (50 pages).
USPTO Final Office Action issued for U.S. Appl. No. 14/295,229, dated May 4, 2017 (25 pages).
USPTO Notice of Allowance issued for U.S. Appl. No. 14/918,356, dated Aug. 8, 2017 (14 pages).

* cited by examiner

ELECTRONIC DEVICE AND METHOD FOR FABRICATING THE SAME

CROSS-REFERENCE TO RELATED APPLICATIONS

The present application is a continuation of, and claims priority and benefits of, U.S. patent application Ser. No. 14/229,745, entitled "ELECTRONIC DEVICE AND METHOD FOR FABRICATING THE SAME," and filed on Mar. 28, 2014, which further claims priority and benefits of Korean Patent Application No. 10-2013-0064700, entitled "SEMICONDUCTOR DEVICE AND METHOD FOR MANUFACTURING THE SAME, AND MICRO PROCESSOR, PROCESSOR, SYSTEM, DATA STORAGE SYSTEM AND MEMORY SYSTEM INCLUDING THE SEMICONDUCTOR DEVICE," and filed on Jun. 5, 2013. The above prior patent applications are incorporated herein by reference in their entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor and related electronic devices have been conducted for the semiconductor devices. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, capable of simplifying a fabrication process and improving a characteristic of the electronic device.

In one aspect, an electronic device is provided to include a semiconductor memory that includes: an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer structure disposed over the bottom layer and protruding out of the interlayer dielectric layer.

In another aspect, an electronic device is provided to include a semiconductor memory that includes: a substrate; an interlayer dielectric layer disposed over the substrate, and having a recess which exposes a portion of the substrate; a bottom contact in the recess; and a resistance variable element including a bottom layer formed over the bottom contact, and a remaining layer structure disposed over the bottom layer and having at least a portion positioned above the interlayer dielectric layer.

In another aspect, an electronic device is provided to include a semiconductor memory that includes: a substrate; an interlayer dielectric layer disposed over the substrate, and having a recess which exposes a portion of the substrate; a bottom contact in the recess; and a resistance variable element including a bottom layer and a remaining layer structure disposed over the bottom layer, wherein the bottom layer is formed over the bottom contact and at least a portion of the bottom layer is filled in the recess.

Implementations of the above device may include one or more of the following.

The remaining layer structure includes an MTJ structure which includes a first magnetic layer, a tunnel barrier layer and a second magnetic layer sequentially stacked, and a top layer which is disposed over the MTJ structure. The remaining layer structure includes a metal oxide. The remaining layer structure includes a phase change material. In some implementations, the bottom layer includes a first part which is filled in the recess and a second part which protrudes out of the interlayer dielectric layer. The bottom layer includes a single layer or a multi-layer including a metal including at least one of Ti, Hf, Zr, Mn, Cr, Zn, Mg, Al, W and Ta, a nitride of the metal or an oxide of the metal. The bottom layer includes a conductive material which is different from a conductive material forming the bottom contact. An entire bottom surface of the remaining layer structure overlaps with a top of the recess, and a width of the bottom surface of the remaining layer structure has a width equal to or smaller than a width of the top end of the recess. The width of the top end of the recess is larger than a width of a bottom end of the recess. The recess has a wine glass-like shape. The recess has a shape of which width gradually decreases from the top end to the bottom end thereof. The bottom layer has a planner top surface. One of the first and second magnetic layers is a pinned layer which has a pinned magnetization direction, and the bottom layer includes a magnetic correction layer which has a magnetization direction opposite to that of the pinned layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory is provided to include: forming an interlayer dielectric layer over a substrate; selectively etching the interlayer dielectric layer to form a recess which exposes a portion of the substrate; forming a bottom contact to partially fill the recess; and forming a resistance variable element including a bottom layer which fills at least a remaining space of the recess over the bottom contact, and a remaining layer which is disposed over the bottom layer and protrudes out of the interlayer dielectric layer. In another aspect, a method for fabricating an electronic device including a semiconductor memory is provided to include: forming an interlayer dielectric layer over a substrate; selectively etching the interlayer to form a recess which exposes a portion of the substrate; forming a bottom contact in the recess; and forming a resistance variable element including a bottom layer over the bottom contact, and remaining layers disposed over the bottom layer. In some implementations, a width of a top end of the recess is greater than a width of a bottom end of the recess. In some implementations, the forming of the recess comprises: forming a hard mask pattern over the interlayer dielectric layer to have an opening with a width smaller than the width of the top end of the recess; isotropically etching a portion of the interlayer dielectric layer which is exposed through the hard mask pattern; and unisotropically etching the interlayer dielectric layer which is exposed through the hard mask pattern, until the substrate is exposed. In some implementations, the forming of the recess comprises: forming a hard mask pattern having an opening of which width is substantially the same as the width of the top end of the recess, over the interlayer dielectric layer; and etching the interlayer dielectric layer which is exposed through the hard mask pattern, such that a width of the recess gradually decreases towards the substrate. In some implementations, the forming of the recess includes: forming a first photoresist over the interlayer dielectric layer; removing a portion of the first photoresist which is not exposed, through exposure and development processes, and thereby forming a first photoresist pattern having an opening of which width is smaller than the width of the top end of the recess; forming a second photoresist over the first photoresist pattern and the interlayer dielectric layer; removing a portion of the second photoresist which is exposed, through exposure and development processes, and thereby forming a second photoresist pattern having an opening of which width is smaller than the width of the top end of the recess and enlarging the opening of the first photoresist pattern; and etching the interlayer dielectric layer using the first photoresist pattern which has the enlarged opening and the second photoresist pattern as etch barriers. In some implementations, the forming of the recess includes: forming a first photoresist pattern over the interlayer dielectric layer to have an opening with a width smaller than the width of the top end of the recess; forming a second photoresist over the first photoresist pattern and the interlayer dielectric layer; forming a second photoresist pattern through exposure and development processes with regard to the second photoresist to have an opening with a width smaller than the width of the top end of the recess, wherein the development process of the second photoresist causes the opening of the first photoresist pattern increases; and etching the interlayer dielectric layer using the first photoresist pattern with the increased opening and the second photoresist pattern as etch barriers. In some implementations, the method further comprises, before the forming of the second photoresist, forming a DBARC (developer-soluble bottom anti-reflective coating) layer over the first photoresist pattern and the interlayer dielectric layer. In some implementations, a portion of the DBARC layer is removed in the forming of the second photoresist pattern. In some implementations, the unexposed portion of the first photoresist and the exposed portion of the second photoresist overlap with each other. In some implementations, the forming of the recess includes: forming a first photoresist pattern over the interlayer dielectric layer to have an opening with a width smaller than the width of the top end of the recess; forming a water-soluble polymer layer to cover the first photoresist pattern; forming a second photoresist pattern over the water-soluble polymer layer having an opening with a width greater than the opening of the first photoresist pattern; removing a portion of the water-soluble polymer layer which is exposed through the second photoresist pattern; and etching the interlayer dielectric layer using the first photoresist pattern and the second photoresist pattern as etch barriers. In some implementations, the removing of the portion of the water-soluble polymer layer is performed by spraying deionized (DI) water. In some implementations, the forming of the bottom layer includes: forming a conductive material to fill the remaining space; and performing a planarization process to expose the interlayer dielectric layer. In some implementations, the forming of the remaining layers includes: forming a stack structure including a first magnetic layer, a tunnel barrier layer and a second magnetic layer over the bottom layer and the interlayer dielectric layer; forming a top layer over the stack structure to be used for patterning of the resistance variable element; and etching the stack structure using the top layer as an etch barrier. In some implementations, the top layer has a width smaller than the top end of the recess.

In another aspect, a method is provided for fabricating an electronic device including a semiconductor memory. The method comprising: forming an interlayer dielectric layer on a substrate to provide a space for forming a bottom contact and at least a portion of a magnetic resistance element; forming the bottom contact and the portion of the magnetic resistance element to locate inside the interlayer dielectric layer; and forming remaining portions of the magnetic resistance element over the interlayer dielectric layer.

In some implementations, the forming of the interlayer dielectric layer includes forming a recess in the interlayer dielectric layer to have a wine glass shape. In some implementations, the forming of the interlayer dielectric layer includes forming a recess in the interlayer dielectric layer to have a downwardly decreasing width. In some implementations, the portion of the magnetic resistance element located inside the interlayer dielectric layer has a thickness determined based on a size of patternable portion of the magnetic resistance element.

In another aspect, a method for fabricating an electronic device including a semiconductor memory is provided. The method may comprise: forming an interlayer dielectric layer over a substrate; selectively etching the interlayer dielectric layer to form a recess which exposes a portion of the substrate; forming a bottom contact in the recess; and forming a resistance variable element including a bottom layer over the bottom contact and having at least a portion filled in the recess, and a remaining layer structure disposed over the bottom layer.

In some implementations, a width of a top end of the recess is greater than a width of a bottom end of the recess. In some implementations, the forming of the recess comprises: forming a hard mask pattern over the interlayer dielectric layer to have an opening with a width smaller than the width of the top end of the recess; isotropically etching a portion of the interlayer dielectric layer which is exposed through the hard mask pattern; and unisotropically etching the interlayer dielectric layer which is exposed through the hard mask pattern until the substrate is exposed. In some implementations, the forming of the recess comprises: forming a hard mask pattern having an opening of which width is substantially the same as the width of the top end of the recess, over the interlayer dielectric layer; and etching the interlayer dielectric layer which is exposed through the hard mask pattern, such that a width of the recess gradually decreases towards the substrate. In some implementations, the forming of the recess comprises: forming a first photoresist pattern over the interlayer dielectric layer to have an opening with a width smaller than the width of the top end of the recess; forming a second photoresist over the first photoresist pattern and the interlayer dielectric layer; forming a second photoresist pattern through exposure and development processes with regard to the second photoresist to have an opening with a width smaller than the width of the top end of the recess, wherein the development process of the second photoresist causes the opening of the first photoresist pattern increases; and etching the interlayer dielectric layer using the first photoresist pattern with the increased opening and the second photoresist pattern as etch barriers.

In some implementations, the method comprises: before the forming of the second photoresist, forming a DBARC (developer-soluble bottom anti-reflective coating) layer over the first photoresist pattern and the interlayer dielectric layer. In some implementations, the forming of the recess includes: forming a first photoresist pattern over the interlayer dielectric layer to have an opening with a width smaller than the width of the top end of the recess; forming a water-soluble polymer layer to cover the first photoresist pattern; forming a second photoresist pattern over the water-soluble polymer layer having an opening with a width greater than the opening of the first photoresist pattern; removing a portion of the water-soluble polymer layer which is exposed through the second photoresist pattern; and etching the interlayer dielectric layer using the first photoresist pattern and the second photoresist pattern as etch barriers. In some implementations, the removing of the portion of the water-soluble polymer layer is performed by spraying deionized (DI) water. In some implementations, the forming of the bottom layer includes: forming a conductive material to fill the remaining space; and performing a planarization process to expose the interlayer dielectric layer. In some implementations, the forming of the remaining layer structure includes: forming a stack structure including a first magnetic layer, a tunnel barrier layer and a second magnetic layer over the bottom layer and the interlayer dielectric layer; forming a top layer over the stack structure for patterning of the resistance variable element; and etching the stack structure using the top layer as an etch barrier. In some implementations, the top layer has a width smaller than the top end of the recess.

In yet another aspect, a method for fabricating an electronic device including a semiconductor memory is provided. The method may comprise: forming an interlayer dielectric layer on a substrate to provide a space for forming a bottom contact and at least a portion of a magnetic resistance element; forming the bottom contact and the portion of the magnetic resistance element to locate inside the interlayer dielectric layer; and forming remaining portions of the magnetic resistance element over the interlayer dielectric layer.

In some implementations, the forming of the interlayer dielectric layer including: forming a recess in the interlayer dielectric layer to have a wine glass shape. In some implementations, the forming of the interlayer dielectric layer includes: forming a recess in the interlayer dielectric layer to have a downwardly decreasing width. In some implementations, the portion of the magnetic resistance element located inside the interlayer dielectric layer has a thickness determined based on a size of patternable portion of the magnetic resistance element.

These and other aspects, implementations and associated advantages are described in greater detail in the drawings, the description and the claims.

DETAILED DESCRIPTION

Figure 1:
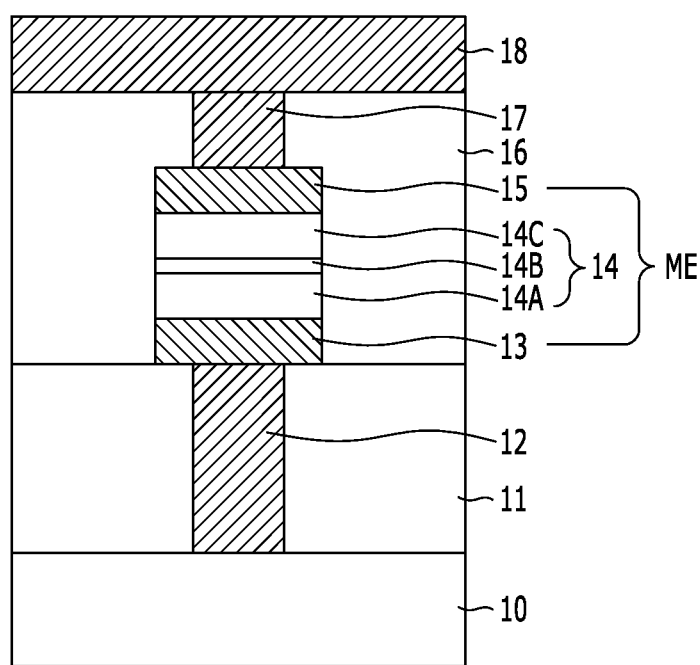
FIG. 1 is a cross-sectional view illustrating a semiconductor device in which a bottom layer is formed over a first interlayer dielectric layer.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating an example of a semiconductor device in which a bottom layer is formed over a first interlayer dielectric layer. In FIG. 1, the semiconductor device includes a resistance variable element switched between different resistance states according to an applied voltage or current. The resistance variable element may be a magnetic resistance element which operates based on a magnetic resistance variation.

Referring to FIG. 1, the semiconductor device includes a magnetic resistance element ME which is interposed between a bottom contact 12 and a top contact 17.

A substrate 10 is provided with a predetermined structure including a switching element (not shown). The end of the predetermined structure, for example, a switching element may be connected with the bottom contact 12 and the other end of the switching element may be connected with, for example, a source line (not shown). The top contact 17 may be connected with, for example, a bit line 18. The magnetic resistance element ME may include an MTJ (magnetic tunnel junction) structure 14 in which a bottom magnetic layer 14A, a tunnel barrier layer 14B and a top magnetic layer 14C are sequentially stacked. A bottom layer 13 is disposed under the MTJ structure 14 to connect the bottom contact 12 with the MTJ structure 14, thereby improving the characteristic of the MTJ structure 14. A top layer 15 is disposed over the MTJ structure 14 to connect the top contact 17 with the MTJ structure 14 and serve as a hard mask for patterning the MTJ structure 14. Reference numerals 11 and 16 denote interlayer dielectric layers.

In one example fabrication process to fabricate this semiconductor device, a series of processes are performed as follows.

An interlayer dielectric layer 11 is formed on the substrate 10, and then the bottom contact 12 is formed to pass through the interlayer dielectric layer 11. Next, a conductive layer for forming the bottom layer 13 and a material layer (for example, a magnetic layer/a dielectric layer/a magnetic layer, for forming the MTJ structure 14) are formed on a resultant structure. After forming the top layer 15 in a way as to be patterned on the material layer, by etching the material layer and the conductive layer using the top layer 15 as an etch barrier, the MTJ structure 14 and the bottom layer 13, which are patterned in the same manner as the top layer 15, are formed. Then, processes for forming the interlayer dielectric layer 16, the top contact 17 and the bit line 18 are performed.

As described above, the magnetic resistance element ME basically has a multi-layered structure. In order to satisfy a recently required characteristic of the magnetic resistance element ME, the number of layers and the thickness of each layer included in the magnetic resistance element ME tends to continuously increase. At the same time, the trend for desiring a higher degree of integration of a semiconductor device tends to require the distance between magnetic resistance elements ME to be decreased.

In fabrication of the semiconductor device of FIG. 1 when the top layer 15 is used as a hard mask during the fabrication, the margin of the hard mask becomes insufficient to pattern the MTJ structure 14 and the bottom layer 13 under an increased degree of integration and increased number of layers and the thickness of each layer in the ME. In order to secure the margin of the hard mask, the thickness of the bottom layer 13 may need to decrease. However, if the thickness of the bottom layer 13 is deceased, the following problems may occur.

In the semiconductor device of FIG. 1, the bottom layer 13 has a planarized surface by depositing a conductive layer and performing a planarization process. The planarization process is performed to avoid the degradation of characteristics of the MTJ structure 14. If the tunnel barrier layer 14B of the MTJ structure 14 is formed on a surface with poor flatness and thus warps, the characteristic of the MTJ structure 14 may be degraded due to a Neel coupling phenomenon. However, if the thickness of the bottom layer 13 is decreased for patterning of the bottom layer 13, it becomes difficult to control the planarization process.

The technology disclosed here provides device structures and fabrication techniques that provide various advantages and can be implemented in specific ways to solve the problems in the semiconductor device of FIG. 1. Detailed description of the present device structures and fabrication techniques and examples of implementations will be given below.

FIGS. 2A to 2F are cross-sectional views explaining a semiconductor device and an example of a method for fabricating the same in accordance with an implementation of the disclosed technology in the present disclosure. As an example, a resistance variable element is included as a magnetic resistance element. However, other implementations are also possible for the magnetic resistance element.

Figure 2A:
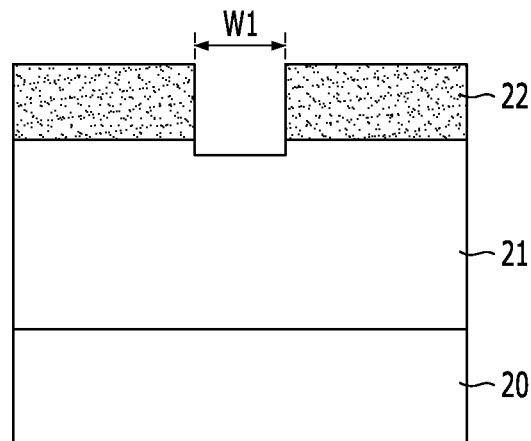
FIGS. 2A to 2F are cross-sectional views explaining a structure of an example of a semiconductor device and an example of a method for fabricating the same in accordance with an implementation of the disclosed technology in the present disclosure.

Referring to FIG. 2A, a substrate 20, which is formed with a desired predetermined structure, for example, a switching element (not shown), is provided. The switching element is to select a memory cell, and may be, for example, a transistor, a diode or the like. One end of the switching element may be electrically connected with a bottom contact which will be described later, and the other end of the switching element may be electrically connected with an wiring line (not shown), for example, a source line.

An interlayer dielectric layer 21 is formed on the substrate 20. The interlayer dielectric layer 21 may be formed using various dielectric materials such as a silicon oxide and so forth.

A first hard mask pattern 22 is formed on the interlayer dielectric layer 21 to have an opening which exposes a region where the bottom contact will be formed. The width of the opening of the first hard mask pattern 22 is denoted by the reference symbol W1. The width W1 of the opening may be substantially the same as a desired bottom width of the bottom contact.

The first hard mask pattern 22 may be formed as a layer with an etching selectivity with respect to the interlayer dielectric layer 21, for example, a photoresist layer, an amorphous carbon layer or a nitride layer. When performing etching to form the first hard mask pattern 22, a portion of the interlayer dielectric layer 21 which is exposed through the first hard mask pattern 22 may be also etched due to over-etching.

Figure 2B:
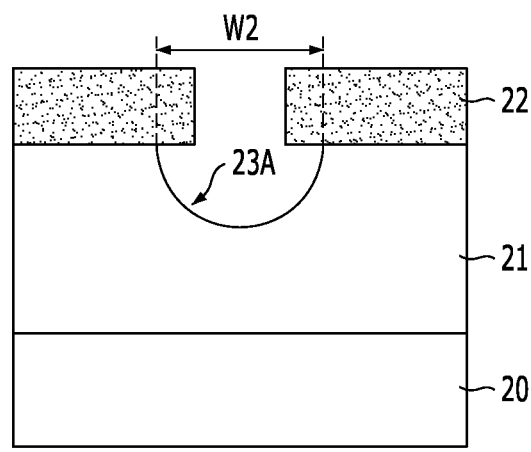

Referring to FIG. 2B, an isotropic etching is performed in etching the portion of the interlayer dielectric layer 21 which is exposed through the first hard mask pattern 22, and thus, a top recess 23A is formed in the interlayer dielectric layer 21. The top end of the top recess 23A has a width W2 greater than the width W1 of the opening of the first hard mask pattern 22. The isotropic etching may be performed as wet etching or dry etching with active chemical reaction.

Figure 2C:
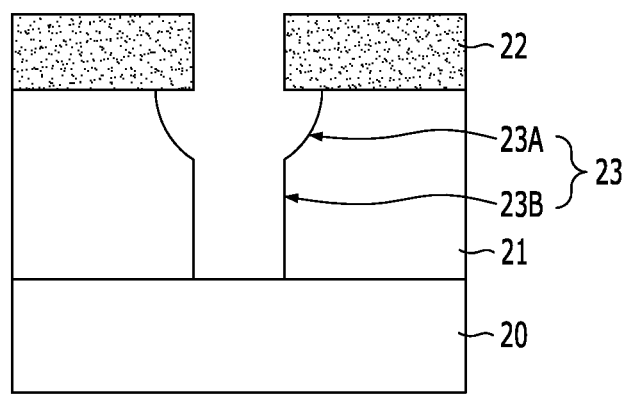

Referring to FIG. 2C, an unisotropic etching is performed in etching the portion of the interlayer dielectric layer 21 which is exposed through the first hard mask pattern 22, and thus, a bottom recess 23B is formed. The bottom recess 23B is formed under the top recess 23A and integrally communicates with the top recess 23A. The unisotropic etching may be performed as dry etching.

The top recess 23A and the bottom recess 23B will be collectively referred to as a recess 23. The recess 23 may have a wine glass shape when viewed in its entirety and provide a space for forming the bottom contact and a portion of a magnetic resistance element. The width W2 of the top end of the recess 23 may be greater than the width of the bottom end of the recess 23 and may be greater than the width W1 of the opening of the first hard mask pattern 22. The width of the bottom end of the recess 23 may be substantially the same as the width W1 of the opening of the first hard mask pattern 22. The order of performing the processes of FIGS. 2B and 2C can be reversed.

Although the recess 23 is described to have a wine glass shape in FIGS. 2A to 2C, various configurations can be made for the shape of the recess 23, which will be described later with reference to FIGS. 4A to 5F.

Figure 2D:
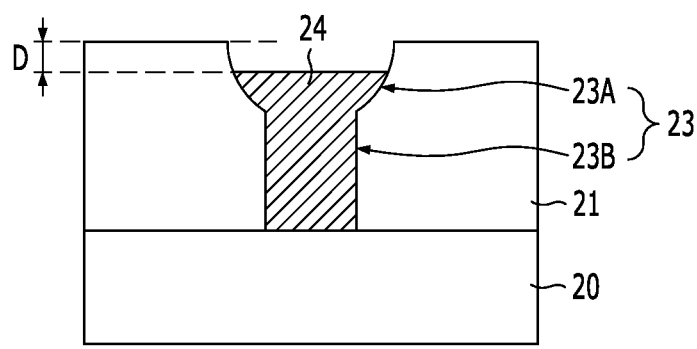

Referring to FIG. 2D, after removing the first hard mask pattern 22, a bottom contact 24 is formed to partially fill the recess 23.

The bottom contact 24 may be formed by depositing a conductive material on the resultant structure obtained after removing the first hard mask pattern 22 and then etching back the conductive material such that the top surface of the bottom contact 24 is lower than the top end of the recess 23 by a predetermined height D. The predetermined height D may be determined based on the thickness of the patternable portion of the magnetic resistance element. For example, the predetermined height D may be not less than a value obtained by subtracting a patternable thickness from the total thickness of a magnetic resistance element.

The conductive material for forming the bottom contact 24 may be a conductive material with an excellent gapfill characteristic and high electrical conductivity, for example, tungsten (W) or a titanium nitride (TiN). The deposition of the conductive material may be performed through CVD (chemical vapor deposition).

Figure 2E:
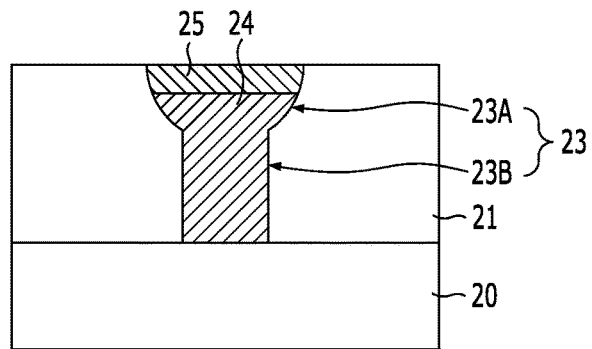

Referring to FIG. 2E, a bottom layer 25 is formed on the bottom contact 24 in such a way as to fill the remainder of the recess 23.

The bottom layer 25 as a part of the magnetic resistance element may include a conductive material different from the bottom contact 24. The bottom layer 25 may be interposed between the bottom contact 24 and an MTJ structure and perform various functions for improving the characteristics or fabrication process of the magnetic resistance element. The bottom layer 25 may be a single layer or a multi-layer. For example, the bottom layer 25 may serve as a barrier layer for preventing the abnormal growth of a metal included in the bottom magnetic layer of the MTJ structure. The bottom layer 25 may be a double layer which is formed up and down. The upper layer of the double layer may be a layer which controls the crystallinity of the bottom magnetic layer of the MTJ structure and controls a TMR (tunneling magneto resistance) value. The lower layer of the double layer may be a layer which may serve as a buffer layer capable of increasing adhesion to the bottom contact 24 and improve the film quality or roughness of the upper layer. The bottom layer 25 may include a magnetic correction layer which has a magnetization direction opposite to a magnetic layer functioning as a pinned layer in the MTJ structure and offset the influence of the magnetic field applied to a free layer by the pinned layer. Such a magnetic correction layer may be a single layer or a multi-layer including a ferromagnetic material, for example, a Co metal, a Fe metal, a Fe—Pt alloy, a Fe—Pd alloy, a Co—Pd alloy, a Co—Pt alloy, a Fe—Ni—Pt alloy, a Co—Fe—Pt alloy or a Co—Ni—Pt alloy. When the magnetic correction layer is a multi-layer including at least two ferromagnetic material layers, a noble metal layer such as of platinum (Pt) or palladium (Pd) may be interposed between the ferromagnetic material layers. For example, the magnetic correction layer may have the stack structure of a ferromagnetic material layer, a noble metal layer, and a ferromagnetic material layer. However, other implementations are also possible. For example, in order to satisfy desired characteristics of a semiconductor device including a magnetic resistance element, the bottom layer 25 may be designed to perform various functions. While the bottom layer 25 may include, for example, a metal such as Ti, Hf, Zr, Mn, Cr, Zn, Mg, Al, W and Ta, a nitride of the metal, or an oxide of the metal, other implementations are also possible. For example, the bottom layer may be a single layer or a multi-layer including various materials.

The bottom layer 25 may be formed to have a thickness sufficiently filling the recess 23 by depositing a conductive material on the resultant structure with the bottom contact 24 and then perform a planarization process, for example, CMP (chemical mechanical polishing) or etch-back, until the surface of the interlayer dielectric layer 21 is exposed.

Since the bottom layer 25 is formed in the upper part of the recess 23, the width of the top surface of the bottom layer 25 has a value that corresponds to the width W2 of the top end of the recess 23. Further, because the thickness D (see FIG. 2D) of the bottom layer 25 need not be small and rather may have a value equal to or larger than a thickness that is difficult to pattern in a magnetic resistance element, the present formation of the bottom layer 25 allows an easier control of the planarization process of the bottom layer 25.

Figure 2F:
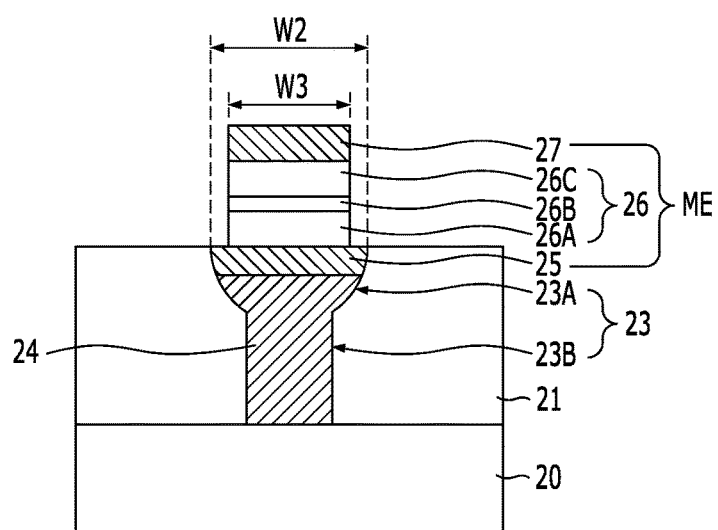

FIG. 2F illustrates and explains how the remaining layers of the magnetic resistance element, for example, the stack structure of an MTJ structure 26 and a top layer 27 are formed on the bottom layer 25.

Material layers for forming the MTJ structure 26 are formed on the resultant structure of FIG. 2E. Next, the top layer 27 is formed on the material layers and patterned in order to pattern the magnetic resistance element. The MTJ structure 26 is formed by etching the material layers using the top layer 27 as an etch barrier. The etching for forming the MTJ structure 26 may be performed as physical etching such as IBE (ion beam etching).

The MTJ structure 26 may include, for example, a bottom magnetic layer 26A, a tunnel barrier layer 26B and a top magnetic layer 26C which are sequentially stacked. One of the bottom magnetic layer 26A and the top magnetic layer 26C may be a pinned layer of which magnetization direction is pinned, and the other thereof may be a free layer of which magnetization direction is changeable. Each of the bottom magnetic layer 26A and the top magnetic layer 26C may be a single layer or a multi-layer including a ferromagnetic material, for example, a Fe—Pt alloy, a Fe—Pd alloy, a Co—Pd alloy, a Co—Pt alloy, a Fe—Ni—Pt alloy, a Co—Fe—Pt alloy or a Co—Ni—Pt alloy. Other implementations are also possible. The tunnel barrier layer 26B may function as an electron tunnel and change the magnetization direction of the bottom magnetic layer 26A or the top magnetic layer 26C. The tunnel barrier layer 26B may be a single layer or a multi-layer including, for example, an oxide such as MgO, CaO, SrO, TiO, VO and NbO. Other implementations are also possible.

In the above example, the MTJ structure 26 includes the tunnel barrier layer 26B interposed between the two magnetic layers 26A and 26C. Other configurations for the MTJ structure 26 are possible. For example, the MTJ structure 26 may further include layers which perform various functions. For example, while not shown, an anti-ferromagnetic material may be additionally formed which pins the magnetization direction of the pinned layer and performs the same function as the above-described magnetic correction layer. The anti-ferromagnetic material may be, for example, a single layer or a multi-layer including FeMN, NiMn, PtMn, PdMn, PtPdMn, RuMn, OsMn, IrMn or CrPtMn. Such additional layer may be formed over or under the bottom magnetic layer 26A or the top magnetic layer 26C which serves as the pinned layer.

The top layer 27 may be a single layer or a multi-layer including a metal or a metal nitride as a conductive material. However, other implementations are also possible.

The top layer 27 may fully overlap with the bottom layer 25, and may have a width W3 that is equal to or smaller than the width W2 of the top surface of the bottom layer 25. Accordingly, the MTJ structure 26 may be present on only the bottom layer 25 and the entire bottom surface of the MTJ structure 26 may overlap with the bottom layer 25.

As a result of this process, a magnetic resistance element ME in which the bottom layer 25, the MTJ structure 26 and the top layer 27 are sequentially stacked may be formed.

While not shown in the present drawing, a dielectric layer which covers the top layer 27 and the MTJ structure 26 may be formed and then subsequent processes may be performed to form a top contact which is connected with the top layer 27 through the dielectric layer. Further, a bit line may be formed on the dielectric layer and connected with the top contact.

The semiconductor device of FIG. 2 includes the interlayer dielectric layer 21 which is disposed on the substrate 20 and has the recess 23, the bottom contact 24 which partially fills the recess 23, the bottom layer 25 of the magnetic resistance element ME which fills the remainder of the recess 23 on the bottom contact 24, and the remaining layers of the magnetic resistance element ME, for example, the MTJ structure 26 and the top layer 27, which are disposed on the bottom layer 25.

The recess 23 has the wine glass shape when viewed in its entirety. Accordingly, the top surface of the bottom layer 25 has a greater width than the lower part of the recess. The entire bottom surface of the MTJ structure 26 may be present on only the bottom layer 25.

In the semiconductor device as described above, data may be stored using a characteristic that the resistance value of the magnetic resistance element ME varies according to the magnetization directions of the bottom magnetic layer 26A and the top magnetic layer 26C. For example, according to the current supplied through the bottom contact 24 and the top contact (not shown), the magnetization directions of the bottom magnetic layer 26A and the top magnetic layer 26C become parallel or anti-parallel to each other. When the magnetization directions are parallel to each other, the magnetic resistance element ME may exhibit a low resistant state and store data '0', and, when the magnetization directions are anti-parallel to each other, the magnetic resistance element ME may exhibit a high resistant state and store data '1'.

The above implementations may be used to achieve one or more following advantages.

First, because the bottom layer 25 as a part of the magnetic resistance element ME is filled in the recess 23 together with the bottom contact 24, etching is not required to form the bottom layer 25. Therefore, a process margin may be increased when patterning the magnetic resistance element ME.

Also, due to the fact that the bottom layer 25 has the shape which is filled in the recess 23, since it is not necessary to decrease the thickness of the bottom layer 25, the planarization process may be easily performed. Namely, the flatness of the top surface of the bottom layer 25 may be secured.

Further, because the width of the top surface of the bottom layer 25 is increased by increasing the width W2 of the top end of the recess 23, an alignment margin may be increased, and thus, it is easy to form the MTJ structure 26 in such a manner that the MTJ structure 26 entirely overlaps with the top surface of the bottom layer 25. Since the flatness of the top surface of the bottom layer 25 is excellent as described above, when the MTJ structure 26 entirely overlaps with the top surface of the bottom layer 25, it is possible to prevent the tunnel barrier layer 26B of the MTJ structure 26 from warping and secure the characteristic of the magnetic resistance element ME. If the MTJ structure 26 is larger than the bottom layer 25 or is misaligned to overlap with also a portion of the interlayer dielectric layer 21, an unevenness may be caused in the tunnel barrier layer 26B of the MTJ structure 26 due to a step which may occur at the boundary between the bottom layer 25 and the interlayer dielectric layer 21 in spite of the planarization process. Such a problem may be solved by the present implementation of the present disclosure.

FIGS. 3A to 3D are cross-sectional views explaining a semiconductor device and an example of a method for fabricating the same in accordance with another implementation of the present disclosure.

Figure 3A:
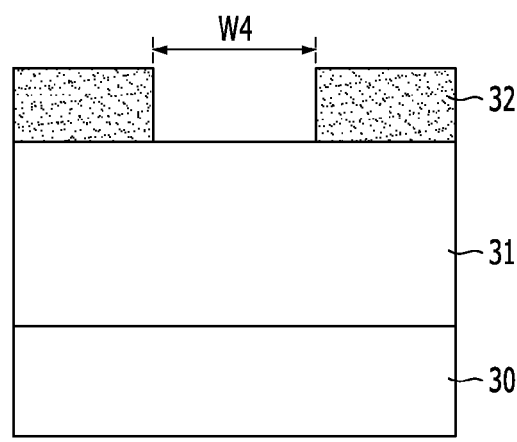
FIGS. 3A to 3D are cross-sectional views explaining a semiconductor device and an example of a method for fabricating the same in accordance with another implementation of the disclosed technology in the present disclosure.

Referring to FIG. 3A, an interlayer dielectric layer 31 is formed on a substrate 30 with a desired predetermined structure, for example, a switching element (not shown).

A first hard mask pattern 32 is formed on the interlayer dielectric layer 31 to have an opening which exposes a region where a bottom contact will be formed. A width W4 of the opening of the first hard mask pattern 32 may be greater than a desired bottom width of the bottom contact, and may correspond to a desired width of the top surface of a bottom layer which will be described later.

Figure 3B:
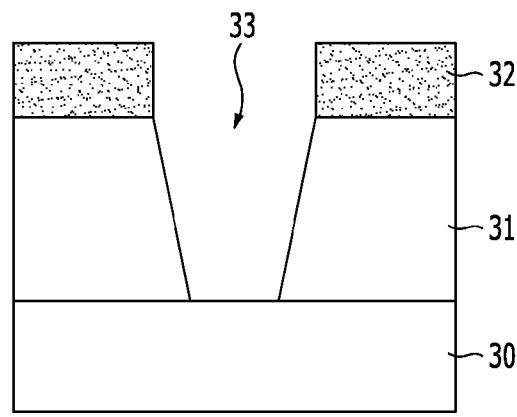

Referring to FIG. 3B, a recess 33 is formed to expose the substrate 30 by etching the interlayer dielectric layer 31 which is exposed through the first hard mask pattern 32. The sloped etching is performed for forming the interlayer dielectric layer 31 and the width of the recess 33 may gradually decrease from the top to the bottom. The sloped etching may be performed such that the width of the bottom of the recess 33 has the desired bottom width of the bottom contact.

Figure 3C:
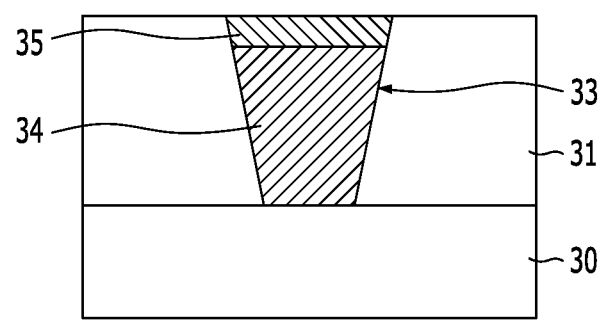

Referring to FIG. 3C, after removing the first hard mask pattern 32, a bottom contact 34 is formed to partially fill the recess 33.

A bottom layer 35 is formed on the bottom contact 34 to fill the remainder of the recess 33. The top surface of the bottom layer 35 may have the same width as the width of the top end of the recess 33.

Figure 3D:
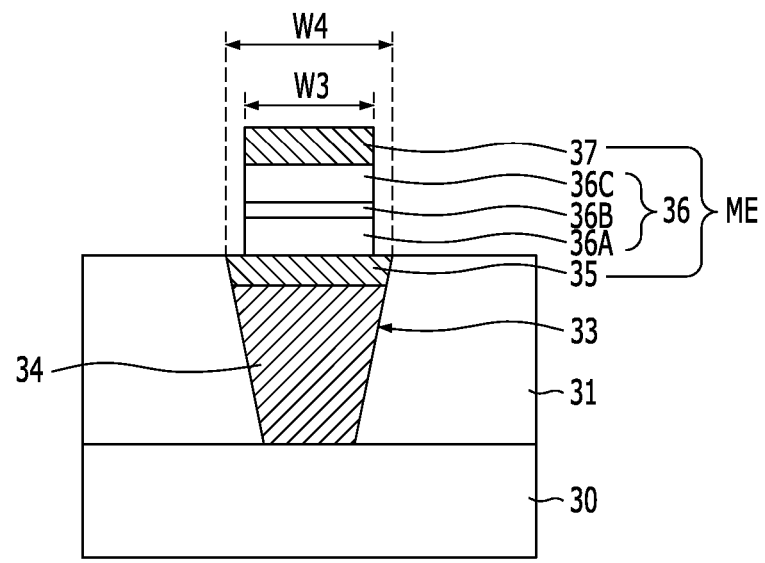

Referring to FIG. 3D, material layers for forming an MTJ structure 36 are formed on the resultant structure of FIG. 3C. Next, a top layer 37 for patterning of a magnetic resistance element is formed on the material layers. By etching the material layers using the top layer 37 as an etch barrier, the MTJ structure 36 is formed. The MTJ structure 36 may include, for example, a bottom magnetic layer 36A, a tunnel barrier layer 36B and a top magnetic layer 36C which are sequentially stacked. As a result of this process, a magnetic resistance element ME in which the bottom layer 35, the MTJ structure 36 and the top layer 37 are sequentially stacked may be formed.

The semiconductor device of FIG. 3D differs from the semiconductor device of FIG. 2F in terms of a method for forming the recess 33 and the shape of the recess 33. In the semiconductor device of FIG. 2F, the recess 23 is formed through two etching processes to have the wine glass shape. In the semiconductor device of FIG. 3D, the recess 33 is formed through one etching process to have a downwardly decreasing shape.

However, the semiconductor device of FIG. 3D and the semiconductor device of FIG. 2F are the same in that the width of the top ends of the recesses 23 and 33 is greater than the width of the bottom ends of the recesses 23 and 33 and that the bottom contact 24 or 34 and the bottom layer 25 or 35 fill different portions of the recesses 23 or 33. The effects as achieved by the semiconductor device of FIG. 2F can be provided in the semiconductor device of FIG. 3D.

While it was explained in the above implementations that the entire bottom layer of the magnetic resistance element is filled in the recess, other limitations are also possible. For example, a bottom layer may have two different portions, one of which resides in a recess and the other of which does not reside in the recess and protrudes out of an interlayer dielectric layer. The one portion of the bottom layer which resides in the recess may have the same plane shape as the top end of the recess. The other portion of the bottom layer which protrudes out of the interlayer dielectric layer may have substantially the same plane shape as the top layer since it is etched using the top layer.

The bottom layer that resides in the recess may have the thickness not less than the thickness that is obtained by subtracting a patternable thickness from the total thickness of a magnetic resistance element. The patternable thickness may be determined based on the distance between adjacent magnetic resistance elements. For example, if patterning of the magnetic resistance element ME is performed through IBE, when the distance between adjacent magnetic resistance elements ME is 100, a patternable thickness may be about 120. If the total thickness of the magnetic resistance element ME exceeds 120, a thickness exceeding the patternable thickness may be buried in the recess.

Moreover, while it was explained in the above implementations that the bottom layer of a magnetic resistance element resides in the recess, other implementations are also possible. Further, the above-described implementations may be applied to various resistance variable elements as well.

For example, a resistance variable element used in an RRAM may include a conductive bottom layer, a conductive top layer and a metal oxide interposed therebetween. The metal oxide may include, for example, a transition metal oxide, a perovskite-based material, and so forth. Such a resistance variable element may exhibit a characteristic switched between different resistant states due to, for example, creation and extinction of current filaments through behavior of vacancies.

Otherwise, a resistance variable element used in a PRAM may include a conductive bottom layer, a conductive top layer and a phase change material interposed therebetween. The phase change material may include, for example, a chalcogenide-based material. Such a resistance variable element may exhibit a characteristic switched between different resistant states, for example, as the phase change material is stabilized to any one of a crystalline state and an amorphous state by heat.

In such various resistance variable elements, the entirety or a portion of the conductive bottom layer may reside in a portion of a recess in which a bottom contact is not formed. Thus, the same effects as those of the above-described implementations may be achieved.

FIGS. 4A to 4F are cross-sectional views explaining an example of a method for forming a recess.

Figure 4A:
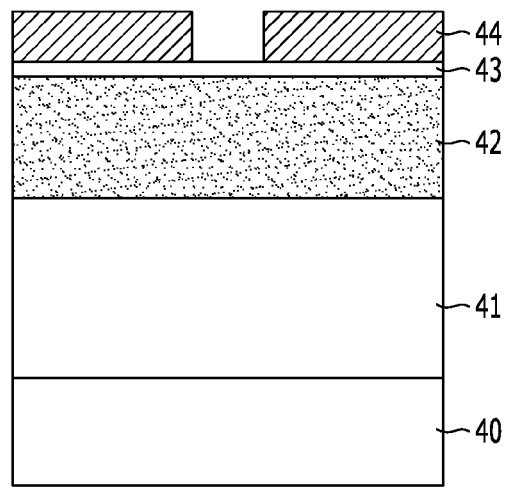
FIGS. 4A to 4F are cross-sectional views explaining an example of a method for forming a recess in a semiconductor device.

Referring to FIG. 4A, a substrate 40, which is formed with a desired predetermined structure, for example, a switching element (not shown), is provided.

An interlayer dielectric layer 41 is formed on the substrate 40. The interlayer dielectric layer 41 may be formed using various dielectric materials such as a silicon oxide and so forth.

A hard mask layer 42 is formed on the interlayer dielectric layer 41. The hard mask layer 42 may be a single layer or a multi-layer including various materials each of which has an etching selectivity with respect to the interlayer dielectric layer 41. For example, the hard mask layer 42 may be a double layer in which an amorphous carbon layer and a SiON layer are stacked.

A first anti-reflective layer 43 is formed on the hard mask layer 42. The first anti-reflective layer 43 may be a BARC (bottom anti-reflective coating) layer.

A first photoresist pattern 44 is formed on the first anti-reflective layer 43 to have an opening which exposes a region where a bottom contact will be formed. The width of the opening of the first photoresist pattern 44 may be substantially the same as a desired bottom width of the bottom contact. The first photoresist pattern 44 may be formed by applying a first photoresist on the first anti-reflective layer 43 and then performing exposure and development. In performing exposure, a portion of the first photoresist which receives light may be substituted by a material including a carboxyl group (—COOH). Development may be performed by NTD (negative-tone development). For the case of NTD, a development solution such as an organic solvent is used, and thus, a portion of the first photoresist which is not exposed may be removed and a portion of the first photoresist which is exposed may not be removed and remain. Therefore, exposure is performed such that a portion of the first photoresist which corresponds to the opening is not exposed and the remaining portion of the first photoresist is exposed.

Figure 4B:
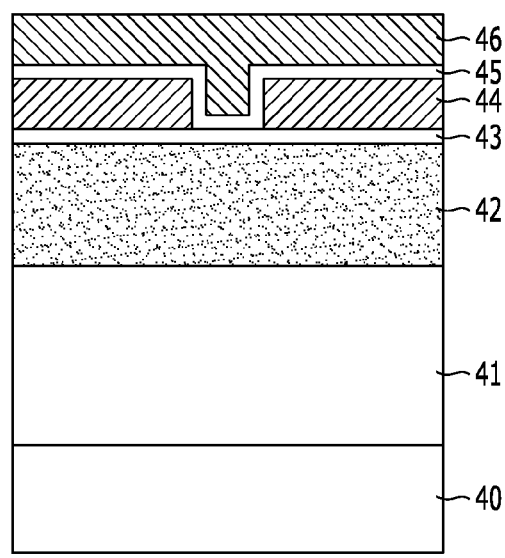

Referring to FIG. 4B, a second anti-reflective layer 45 is formed along the profile of FIG. 4A. The second anti-reflective layer 45 may be a DBARC (developer-soluble bottom anti-reflective coating) layer.

A second photoresist 46 is applied on the second anti-reflective layer 45.

Figure 4C:
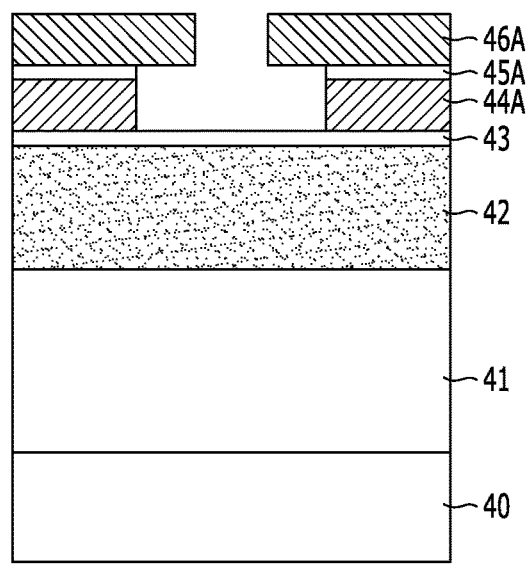

Referring to FIG. 4C, a second photoresist pattern 46A is formed by exposing and developing the second photoresist 46. The second photoresist pattern 46A has an opening which exposes a region where the bottom contact will be formed, and the width of the opening may be substantially the same as the desired bottom width of the bottom contact. Development may be performed by PTD (positive-tone development). For the case of PTD, a development solution such as a TMAH (tetra methyl ammonium hydroxide) is used, and thus, a portion of the second photoresist 46 which is exposed may be removed and a portion of the second photoresist 46 which is not exposed may not be removed and remain. Therefore, exposure is performed such that a portion of the second photoresist 46 which corresponds to the opening may be exposed and the remaining portion of the second photoresist 46 may not be exposed.

In the course of developing the second photoresist 46, a portion of the second anti-reflective layer 45 including a DBARC layer may be removed by the development solution. The second anti-reflective layer 45 which is partially removed will be referred to as a second anti-reflective layer pattern 45A.

Further, in the course of developing the second photoresist 46, a portion of the first photoresist pattern 44 may be removed by the development solution. This is because the first photoresist pattern 44 has already received light in the exposure process of the first photoresist and the development of the second photoresist 46 is performed in the scheme of PTD. The first photoresist pattern 44 which is partially removed will be referred to as a final or remaining first photoresist pattern 44A. The width of the opening of the remaining first photoresist pattern 44A is greater than the width of the opening of the first photoresist pattern 44 and the width of the opening of the second photoresist pattern 46A.

The hard mask layer 42 and the interlayer dielectric layer 41 are etched using the remaining first photoresist pattern 44A and the second photoresist pattern 46A as etch barriers until the substrate 40 is exposed. This procedure will be described in detail with reference to FIGS. 4D to 4F.

Figure 4D:
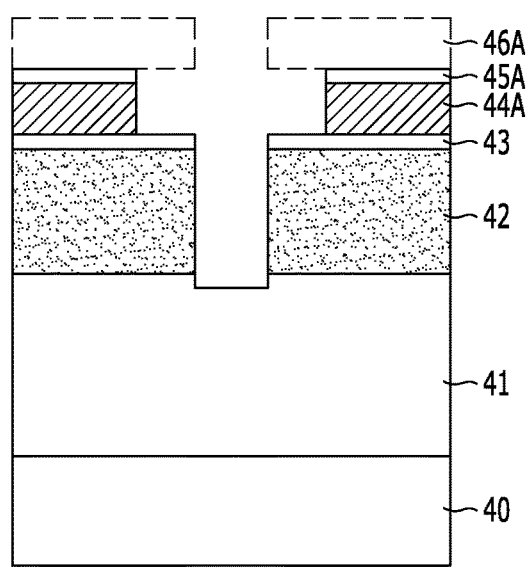

Referring to FIG. 4D, since the overlying second photoresist pattern 46A serves as an etch barrier at an initial etching stage, a hole corresponding to the opening of the second photoresist pattern 46A is formed in the hard mask layer 42 and/or a portion of the interlayer dielectric layer 41 until the second photoresist pattern 46A is entirely lost.

Figure 4E:
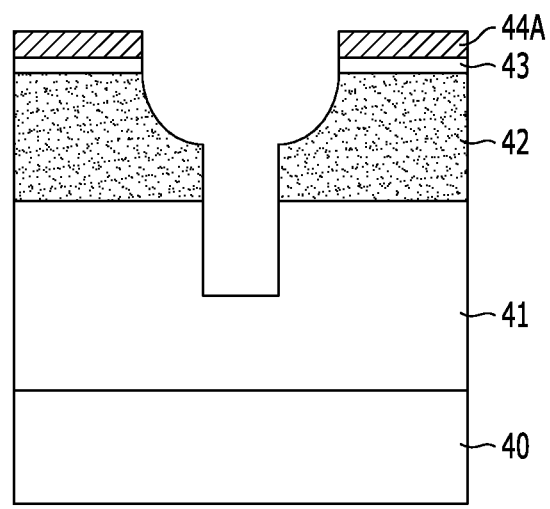

Referring to FIG. 4E, after the second photoresist pattern 46A is lost, the hard mask layer 42 and/or the interlayer dielectric layer 41 are etched using the remaining first photoresist pattern 44A as an etch barrier. The opening of the remaining first photoresist pattern 44A is greater than the opening of the second photoresist pattern 46A. Further, portions of the hard mask layer 42 and/or the interlayer dielectric layer 41 which have been already etched using the second photoresist pattern 46A are positioned lower than the other portions. Thus, a wine glass-like recess is formed to have a portion which gradually increases downward.

Figure 4F:
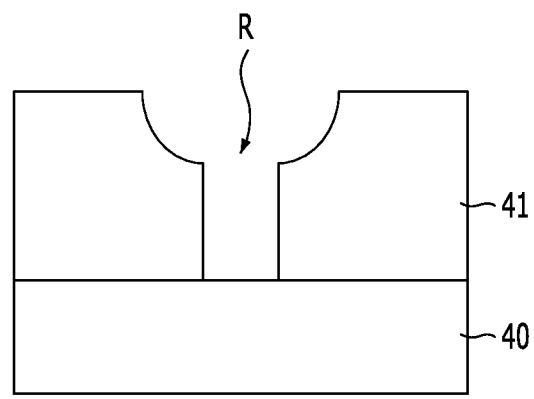

Referring to FIG. 4F, a recess R with a wine glass shape may be formed in the interlayer dielectric layer 41.

In the present implementation, unlike the aforementioned implementation, it is possible to form the recess R with a wine glass shape through one etching process.

FIGS. 5A to 5F are cross-sectional views explaining an example of a method for forming a recess.

Figure 5A:
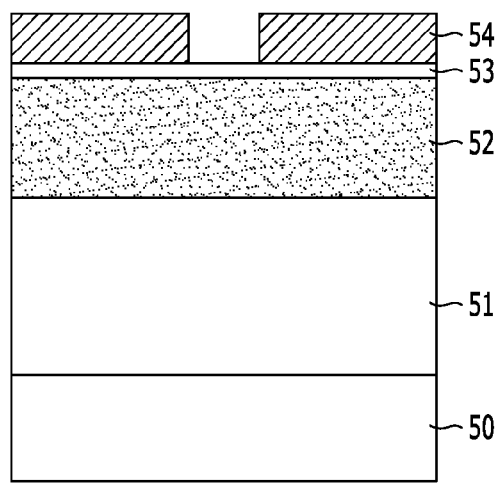
FIGS. 5A to 5F are cross-sectional views explaining an example of a method for forming a recess in a semiconductor device.

Referring to FIG. 5A, an interlayer dielectric layer 51, a hard mask layer 52 and an anti-reflective layer 53 are formed on a substrate 50, which is formed with a desired predetermined structure, for example, a switching element (not shown).

A first photoresist pattern 54 having an opening which exposes a region where a bottom contact will be formed is formed on the anti-reflective layer 53. The width of the opening of the first photoresist pattern 54 may be substantially the same as a desired bottom width of the bottom contact.

Figure 5B:
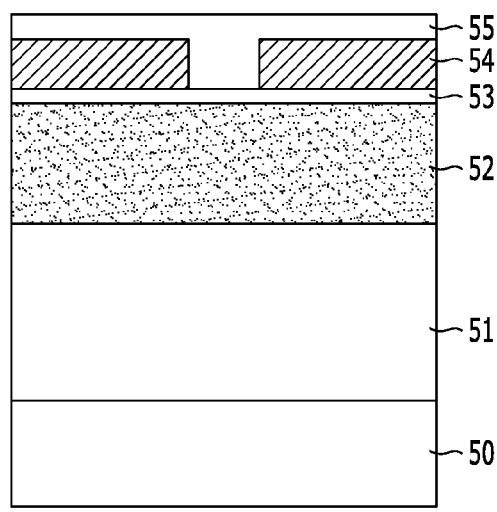

Referring to FIG. 5B, a water-soluble polymer layer 55 is formed on the resultant structure of FIG. 5A, through coating. Because the water-soluble polymer layer 55 does not react with a photoresist, it may not exert any influence on the first photoresist pattern 54 and a second photoresist pattern which will be formed through a subsequent process. In addition, the water-soluble polymer layer 55 may have a planar surface which enables to easily fill the opening of the first photoresist pattern 54. Thus, a subsequent process for forming the second photoresist pattern can be easily performed.

Figure 5C:
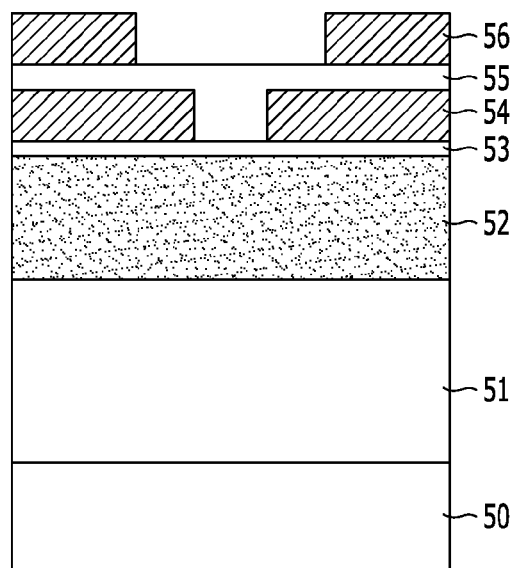

Referring to FIG. 5C, a second photoresist pattern 56 is formed on the water-soluble polymer layer 55. The opening of the second photoresist pattern 56 may have a width greater than the width of the opening of the first photoresist pattern 54 while overlapping with the opening of the first photoresist pattern 54.

Figure 5D:
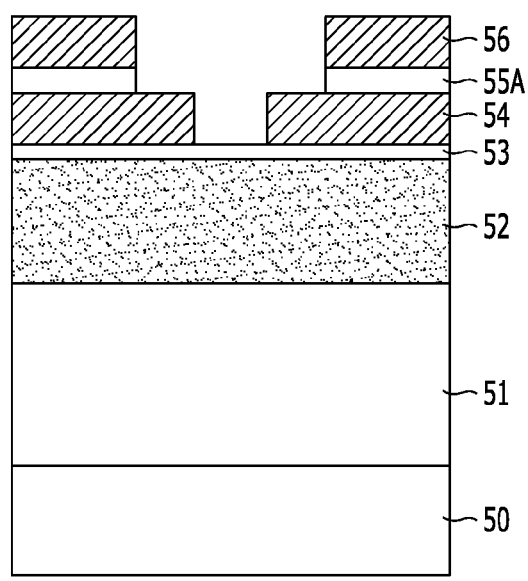

Referring to FIG. 5D, a portion of the water-soluble polymer layer 55 which is exposed through the second photoresist pattern 56 is removed. This removal process may be performed by spraying deionized (DI) water to the resultant structure of FIG. 5C. As a result, a water-soluble polymer pattern 55A is present between the second photoresist pattern 56 and the first photoresist pattern 54.

The hard mask layer 52 and the interlayer dielectric layer 51 are etched using the first photoresist pattern 54 and the second photoresist pattern 56 as etch barriers until the substrate 50 is exposed. This procedure will be explained in detail with reference to FIGS. 5E and 5F.

Figure 5E:
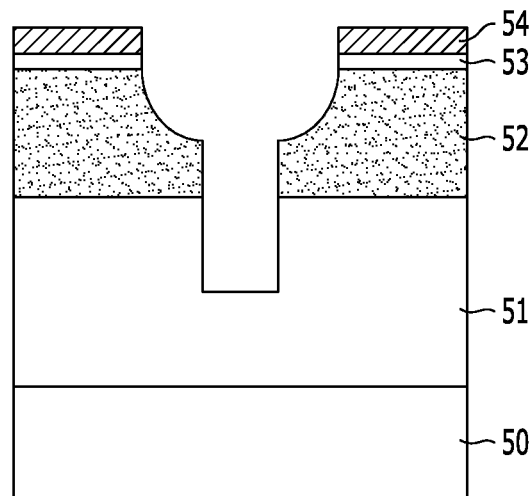

Referring to FIG. 5E, when etching the hard mask layer 52 and the interlayer dielectric layer 51, the portion of the hard mask layer 52 which is exposed through the opening of the first photoresist pattern 54 is etched first and a hole corresponding to the opening is formed. The portion of the hard mask layer 52 over which the first photoresist pattern 54 is present and the second photoresist pattern 56 is not present is etched relatively slowly. Accordingly, a recess is formed to have a wine glass shape having a portion which gradually increases downward.

Figure 5F:
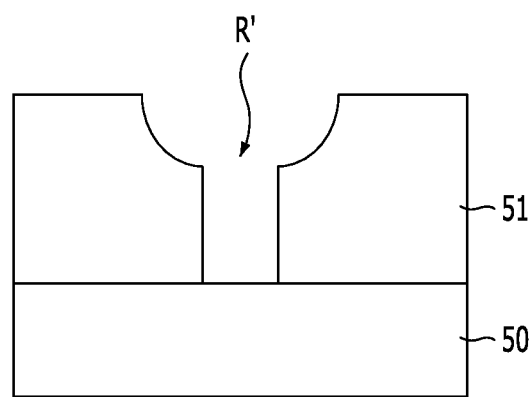

Referring to FIG. 5F, a recess R' with a wine glass shape may be formed in the interlayer dielectric layer 51.

In the present implementation, it is possible to form the recess R' with a wine glass shape through one etching process.

The above and other memory circuits or semiconductor devices based on the disclosed technology can be used in a range of devices or systems. FIGS. 6-10 provide some examples of devices or systems that can implement the memory circuits disclosed herein.

Figure 6:
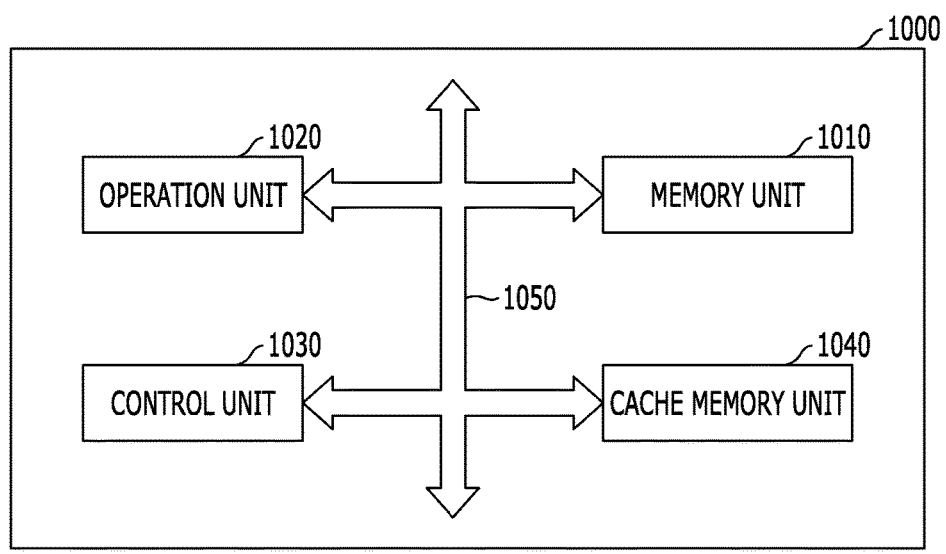
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the memory unit 1010 may be prevented. As a consequence, reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
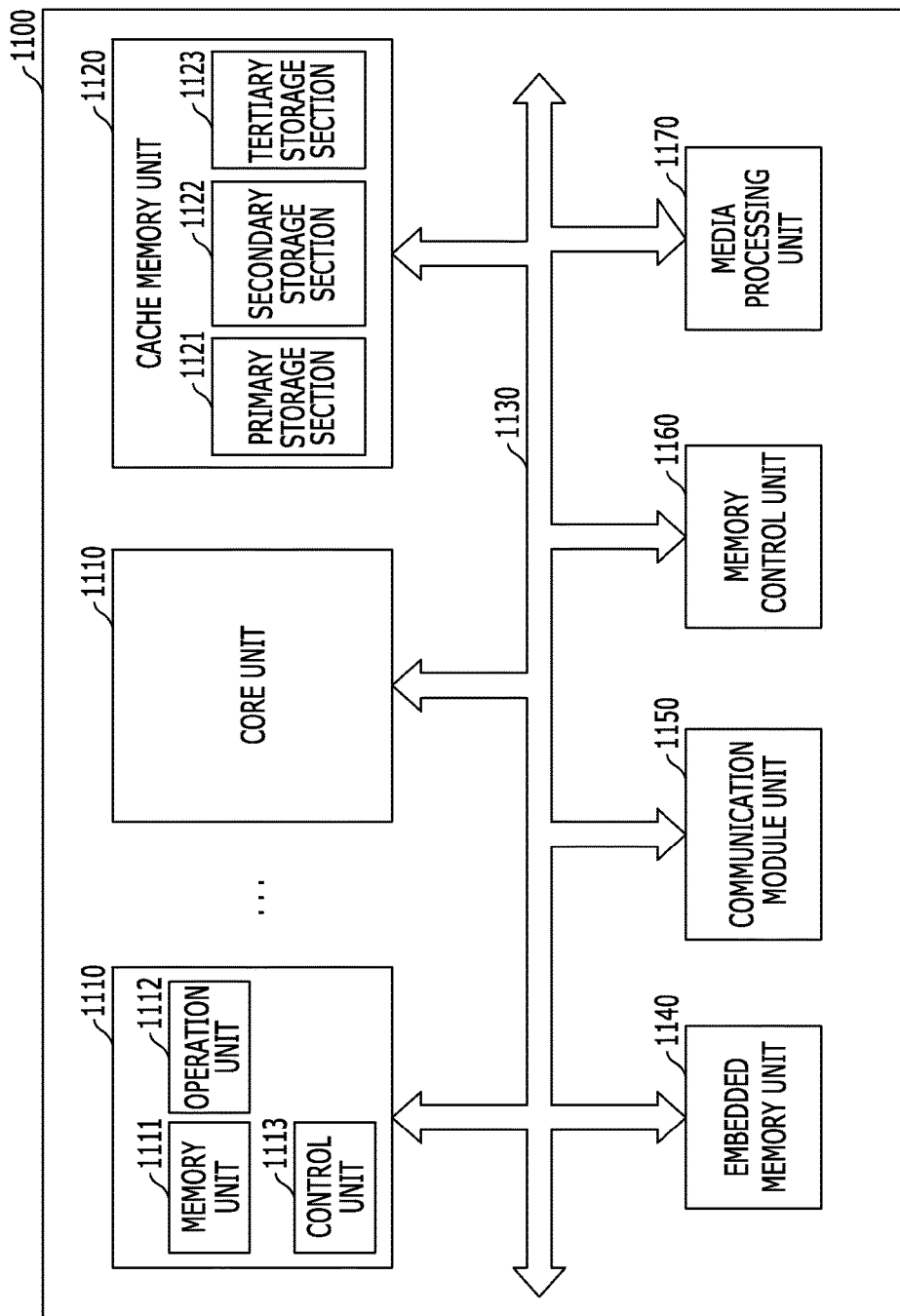
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the cache memory unit 1120 may be prevented. As a consequence, reliability of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120.

The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
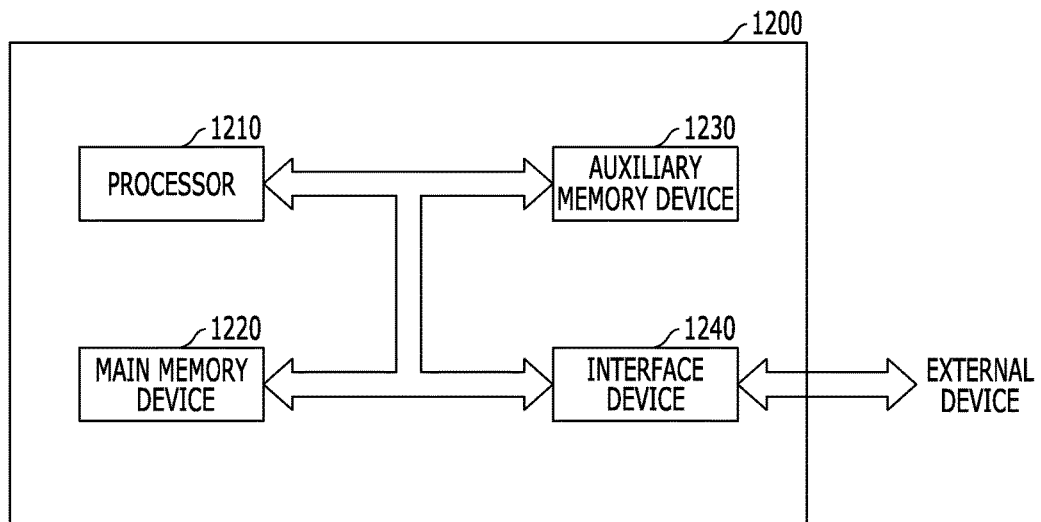
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the main memory device 1220 may be prevented. As a consequence, reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the auxiliary memory device 1230 may be prevented. As a consequence, reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
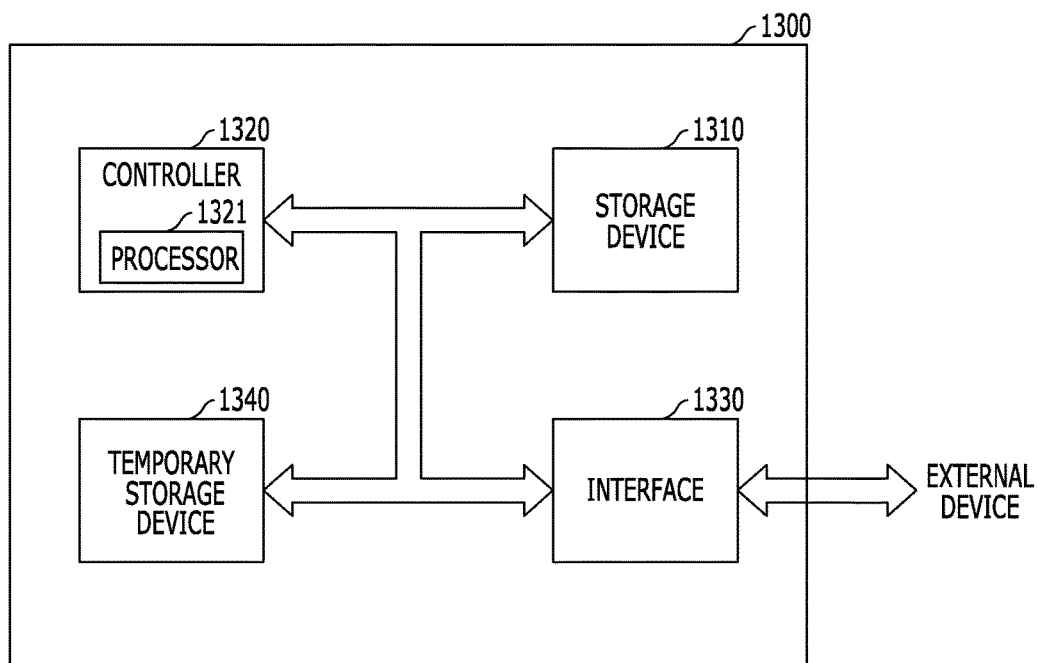
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the temporary storage device 1340 may be prevented. As a consequence, reliability of the data storage system 1300 may be improved.

Figure 10:
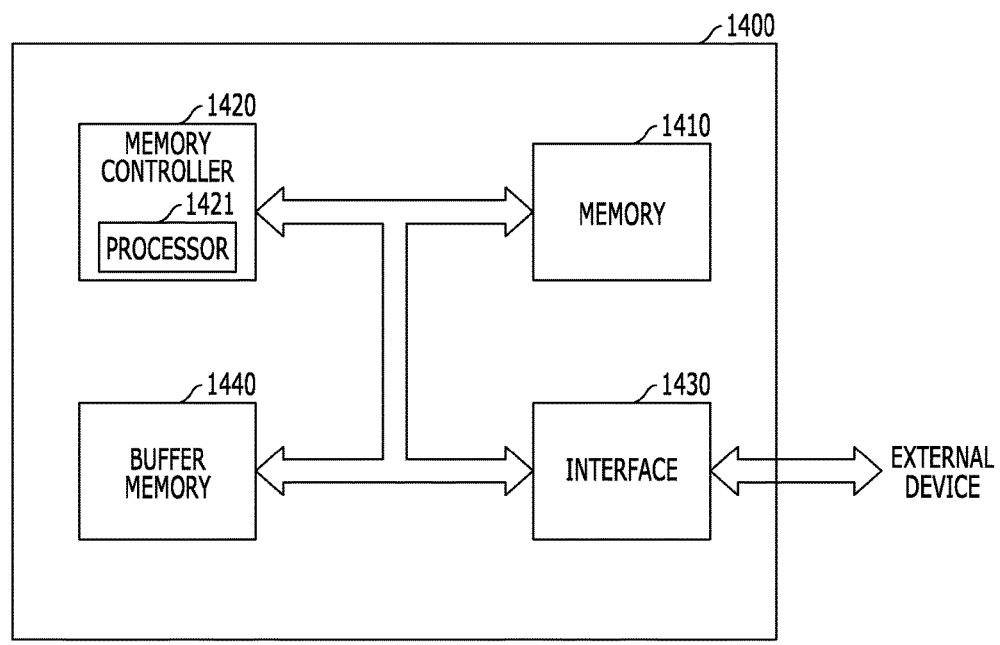
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the memory 1410 may be prevented. As a consequence, reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer disposed over a substrate, and having a recess which exposes a portion of the substrate; a bottom contact partially filling the recess; and a resistance variable element including a bottom layer which fills at least a remaining space of the recess over the bottom contact, and a remaining layer which is disposed over the bottom layer and protrudes out of the interlayer dielectric layer. Through this, reliability degradation due to process inferiority of the buffer memory 1440 may be prevented. As a consequence, reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, comprising:
    forming an interlayer dielectric layer over a substrate;
    selectively etching the interlayer dielectric layer to form a recess to pass through the interlayer dielectric layer and expose a portion of the substrate,
    forming a bottom contact in the recess to include an upper bottom contact portion that is located above the substrate and buried in the interlayer dielectric layer to have a top contact surface below a top surface of the recess, and a lower bottom contact portion that is in contact with the exposed portion of the substrate; and
    forming a resistance variable element including a bottom layer over the top contact surface of the upper bottom contact portion of the bottom contact and having at least a portion filled in the recess below the top surface of the recess, and a remaining layer structure disposed over the bottom layer.

2. The method according to claim 1, wherein a width of a top end of the recess is greater than a width of a bottom end of the recess.

3. The method according to claim 1, wherein the forming of the recess comprises:
    forming a hard mask pattern over the interlayer dielectric layer to have an opening with a width smaller than the width of the top end of the recess;
    isotropically etching a portion of the interlayer dielectric layer which is exposed through the hard mask pattern; and
    unisotropically etching the interlayer dielectric layer which is exposed through the hard mask pattern until the substrate is exposed.

4. The method according to claim 1, wherein the forming of the recess comprises:
    forming a hard mask pattern having an opening of which width is substantially the same as the width of the top end of the recess, over the interlayer dielectric layer; and
    etching the interlayer dielectric layer which is exposed through the hard mask pattern, such that a width of the recess gradually decreases towards the substrate.

5. The method according to claim 1, wherein the forming of the recess comprises:
    forming a first photoresist pattern over the interlayer dielectric layer to have an opening with a width smaller than the width of the top end of the recess;
    forming a second photoresist over the first photoresist pattern and the interlayer dielectric layer;
    forming a second photoresist pattern through exposure and development processes with regard to the second photoresist to have an opening with a width smaller than the width of the top end of the recess, wherein the development process of the second photoresist causes the opening of the first photoresist pattern increases; and
    etching the interlayer dielectric layer using the first photoresist pattern with the increased opening and the second photoresist pattern as etch barriers.

6. The method according to claim 5, comprising:
before the forming of the second photoresist, forming a DBARC (developer-soluble bottom anti-reflective coating) layer over the first photoresist pattern and the interlayer dielectric layer.

7. The method according to claim 1, wherein the forming of the recess includes:
forming a first photoresist pattern over the interlayer dielectric layer to have an opening with a width smaller than the width of the top end of the recess;
forming a water-soluble polymer layer to cover the first photoresist pattern;
forming a second photoresist pattern over the water-soluble polymer layer having an opening with a width greater than the opening of the first photoresist pattern;
removing a portion of the water-soluble polymer layer which is exposed through the second photoresist pattern; and
etching the interlayer dielectric layer using the first photoresist pattern and the second photoresist pattern as etch barriers.

8. The method according to claim 7, wherein the removing of the portion of the water-soluble polymer layer is performed by spraying deionized (DI) water.

9. The method according to claim 1, wherein the forming of the bottom layer includes:
forming a conductive material to fill the remaining space; and
performing a planarization process to expose the interlayer dielectric layer.

10. The method according to claim 1, wherein the forming of the remaining layer structure includes:
forming a stack structure including a first magnetic layer, a tunnel barrier layer and a second magnetic layer over the bottom layer and the interlayer dielectric layer;
forming a top layer over the stack structure for patterning of the resistance variable element; and
etching the stack structure using the top layer as an etch barrier.

11. The method according to claim 10, wherein the top layer has a width smaller than the top end of the recess.

12. The method according to claim 1, wherein the selective etching of the interlayer dielectric layer includes providing the recess to have a bottom surface located above an entire top surface of the substrate.

13. The method according to claim 1, wherein the substrate has a uniform thickness along a horizontal direction.

14. The method according to claim 1, wherein the selective etching of the interlayer dielectric layer includes providing the recess to have a wine glass-like shape.

15. The method according to claim 1, wherein the selective etching of the interlayer dielectric layer includes providing the recess to have a shape gradually decreasing from a top end to a bottom end of the recess.

16. The method according to claim 1, wherein the forming of the resistance variable element includes forming a stack structure including a first magnetic layer, a tunnel barrier layer and a second magnetic layer to cause an entire stack structure to be disposed over the bottom layer.

17. The method according to claim 1, wherein the forming of the resistance variable element includes forming a stack structure including a first magnetic layer and a second magnetic layer, the resistance variable element having a resistance value that varies according to the magnetization directions of the first magnetic layer and the second magnetic layer.

18. The method according to claim 1, wherein the forming of the bottom contact includes forming the bottom layer with a first material and the forming of the resistance variable element includes providing the bottom layer with a second material different from the first material.

19. The method according to claim 1, wherein the forming of the resistance variable element includes constructing an entire bottom surface of the remaining layer structure to overlap with a top of the recess.

20. The method according to claim 1, wherein the forming of the resistance variable element includes constructing the remaining layer structure to have a bottom surface with a width equal to or smaller than a width of a top of the recess.

* * * * *